(12) United States Patent
Fassnacht et al.

(10) Patent No.: US 7,392,497 B2
(45) Date of Patent: Jun. 24, 2008

(54) REGULAR ROUTING FOR DEEP SUB-MICRON CHIP DESIGN

(75) Inventors: Uwe Fassnacht, Sunnyvale, CA (US); Juergen Koehl, Weil im Schoenbuch (DE)

(73) Assignee: International Business Machines Corporation, Armonk, NY (US)

( * ) Notice: Subject to any disclaimer, the term of this patent is extended or adjusted under 35 U.S.C. 154(b) by 485 days.

(21) Appl. No.: 11/160,607

(22) Filed: Jun. 30, 2005

(65) Prior Publication Data

US 2006/0031805 A1 Feb. 9, 2006

(51) Int. Cl.
*G06F 17/50* (2006.01)

(52) U.S. Cl. .............................. 716/12; 716/13; 716/14; 716/15

(58) Field of Classification Search ............... 716/12–14
See application file for complete search history.

(56) References Cited

U.S. PATENT DOCUMENTS

| | | | | |
|---|---|---|---|---|
| 6,166,442 A | * | 12/2000 | Nakamura | 257/773 |
| 6,505,334 B1 | * | 1/2003 | Tanaka | 716/13 |
| 6,919,619 B2 | * | 7/2005 | Sylvester et al. | 257/662 |
| 7,146,593 B2 | * | 12/2006 | Travis et al. | 716/10 |

FOREIGN PATENT DOCUMENTS

JP 03200331 A * 9/1991

* cited by examiner

*Primary Examiner*—Jack Chiang
*Assistant Examiner*—Brandon W Bowers
(74) *Attorney, Agent, or Firm*—Michael J. Le Strange

(57) ABSTRACT

A method of routing an interconnect metal layer of an integrated circuit, wherein single-width nets are replicated and routed in parallel to reduce the total resistance on the net; wide wires are decomposed into a several single-width wires routed in parallel to improve uniformity of metal interconnect routing and therefore manufacturability of metal interconnect layers. The decomposition step is performed during a preliminary wire route after initial physical placement. Access to pin shapes is ensured through a branching and a recombination of the parallel single-width wires. Separate wire segments are rejoined at the source and sink of the net. The parallel wire segments do not change the logic behavior of the circuit.

15 Claims, 3 Drawing Sheets

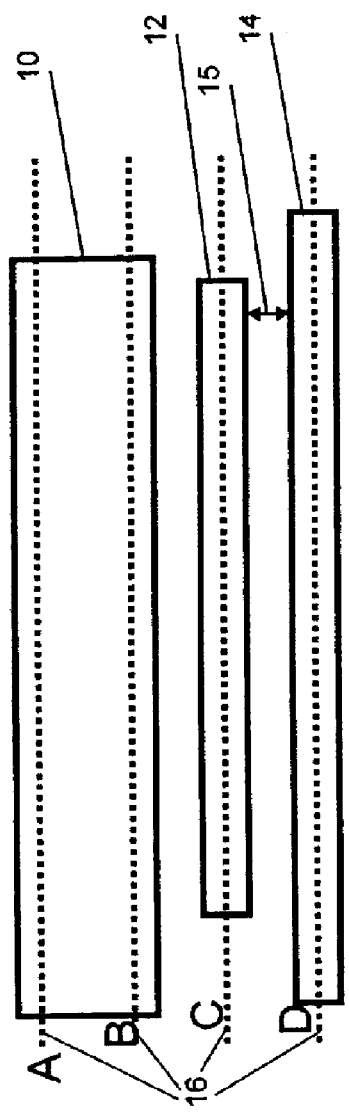
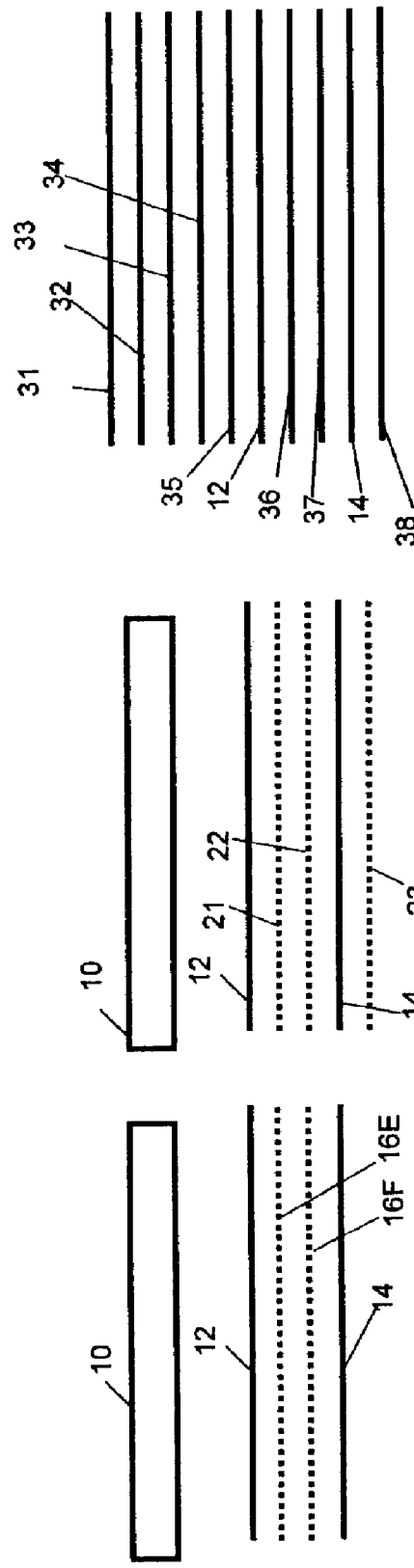
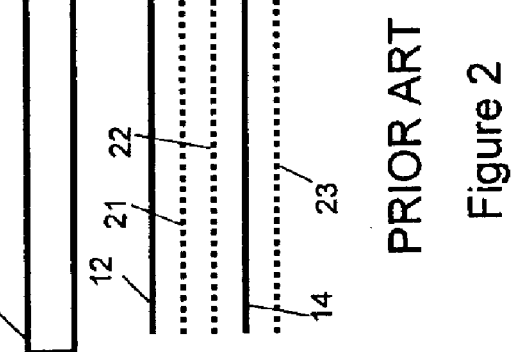
Figure 1A PRIOR ART
Figure 3
Figure 2 PRIOR ART
Figure 1 PRIOR ART

REGULAR ROUTING FOR DEEP SUB-MICRON CHIP DESIGN

FIELD OF THE INVENTION

The present invention relates generally to semiconductor integrated circuit design methods, and particularly to a method for routing interconnect layers in deep sub-micron process technologies.

BACKGROUND OF THE INVENTION

The present invention is applicable in manufacturing various types of semiconductor devices, which comprise a semiconductor wafer substrate, usually of doped monocrystalline silicon (Si), having at least one active device region or component (e.g., an MOS type transistor, a diode, etc.) formed thereon, and a plurality of sequentially formed inter-layer dielectrics (ILDs) and patterned conductive interconnect layers. With the above mentioned components, an integrated circuit is formed containing a plurality of patterns of conductive lines separated by interwiring spacings, and a plurality of interconnection lines, such as bus lines, bit lines, word lines, and logic interconnect lines. Typically, the conductive patterns of vertically spaced metal layers are electrically interconnected by a vertically oriented conductive metal plug structure known as a "VIA." A via is formed in the ILD separating the metal layers, while another conductive plug filling a contact area hole establishes Ohmic contact with an active region, such as a source or drain region of an MOSFET formed on the semiconductor substrate. Conductive lines formed in groove or trench—like openings in overlying dielectric layers extend substantially parallel to the semiconductor substrate and may include five or more metal levels in order to satisfy device geometry and scaling requirements.

In sub-micron process technologies, automated router tools are used to produce the physical routing structures in the metal layers. However, a number of design constraints limit the wireability of many chip designs due to redundancy requirements and various post processing steps intended to increase manufacturing yield. For example, to reduce the incidence of non-planar metal shapes in a design, a wide wire may be decomposed into several narrower wires. Post processing steps may include "cheese" and "fill," which address manufacturing problems associated with non-planarity and metal density. EP 0 982 774 describes a problem known as "dishing," which occurs in wide metal shapes. Dishing is a condition where an indentation, depression or dip is formed in the central portion of the wire. In the case where a wire shape includes a large lateral extension, the solution proposed by EP 0 982 774 replaces the wide wire with a plurality of narrower wires to achieve improved planarity of the wire surfaces. For some cases the narrower wires have lateral extensions that are still quite large and may still be characterized as "wide" wires for a given process technology. However, decomposition of a wide wire into a plurality of narrower width wires consumes additional wiring channels because the same overall current density and electro-migration requirements must be met for the decomposed wire.

Of course, the routed metal structures become more complex as more wires are routed per unit area. In many current designs, the majority of internal signals are routed using narrow single width wires. Consequently, new technical problems in manufacturing emerge in far smaller scale than mentioned above in context with EP 0 982 774. Very often the above-referenced metal shapes in a given plane are quite irregular in sub-micron process technologies. Those skilled in the art recognize that an irregular routing structure in small geometries is detrimental to manufacturing yield. This is due to optical effects, which reduce the resolution of the wire edge shapes. This is particularly true of wire ends, corners, or in metal shapes having complex geometries included in the routing structure. In short, manufacturing yield improves dramatically when metal layers exhibit uniform and predictable layout patterns. Accordingly, EP 0 982 774 does not address the critical manufacturing concerns associated with current process technologies.

One ideal solution would be to cover every routing track with a wire of identical width and spacing to its neighbours, thereby creating very regular metals structures. This, of course, is not possible as it would defeat the very purpose of routing a chip, which is to connect certain pins with each other, without creating electrical connections to pins that are not meant to be connected to a given wire.

FIG. 1 depicts a schematic zoom view of an exemplary section of chip wiring, in which the wiring structure shows wide wire 10, first signal wire 12, and second signal wire 14. All wires are arranged in parallel to each other. In general, wide wire 10 is typically about 50 times wider than the narrow signal wires 12 and 14. Two empty wiring tracks 16E-F are depicted adjacent to wires 12 and 14, and shown in FIG. 2 as fill shapes 21-23, as discussed infra.

FIG. 1A illustrates an isolated section of a wiring grid with wires 10, 13 and 14; wiring channels 16A-D; and spaces between wires 15. The term "wiring" is meant to comprise any collection of wire elements. A single "wire" is understood to be a single segment and mostly longitudinal conductive layer. The narrowest width wires for a given process technology and yield requirement form a characteristic geometric unit defined in the design ground rules for chip wiring. Such wires are considered as "single" objects, and are referred to as "single width wires," which are depicted as 12 or 14 in FIGS. 1 to 6. Wide wires may also be defined as, for example, wire 10, which is intended to be a "double-wide" wire as compared to wire 12.

Wiring tracks 16A-F represent imaginary lines associated with the physical wire shape—whether for a single width wire or larger. The wire tracks typically form a grid having constant minimum space between adjacent wire pairs as defined in the design ground rules for a given process technology. The grid layout of the tracks corresponds to the maximum attainable density for single width wires. However, wide wires, such as wire 10 consume multiple wiring tracks.

A wire grid consisting of an array of single width wires exhibits identical spacing between adjacent wires as shown in FIG. 1A. Wire space 15 represents the minimum space allowed between the edges of adjacent wires 12 and 14. The separation between adjacent, parallel wirings tracks is often twice the width of the wire as measured from the centerline to centerline of the wire tracks. The wire pitch is defined as the minimum distance between adjacent wire tracks.

FIG. 2 shows a prior art approach to eliminating irregular routing structures that fill up unused wiring tracks 16 with "fill" patterns, which are sometimes connected to ground or to the supply voltage. In FIG. 2, the wiring shapes include fill patterns 21-23, to illustrate how fill shapes are combined with wire shapes to achieve uniform density in regions of the metal layer where not all wiring channels are utilized for signal routing.

The drawback of the approach shown in FIG. 2 is that fill patterns 21-23 may add switching capacitance to signal wires 12 and 14 and therefore increase the signal propagation time for the adjacent signal wires. Another disadvantage in the case of grounded fill patterns, is that shorts between signal wires and the adjacent grounded fill patterns can lead to a physical defect on the chip, which can limit manufacturing yield.

SUMMARY OF THE INVENTION

The foregoing discussed drawbacks and deficiencies of the prior art are overcome or alleviated by the method disclosed herein for wire routing of integrated circuits fabricated in deep sub-micron process technologies. A more efficient and robust interconnect routing methodology is achieved by the features stated in the appended independent claims. Further advantageous arrangements and embodiments of the invention are set forth in the appended dependent claims.

According to a first aspect of the present invention, a preliminary functional routing is performed to define the basic routing structures required for all the nets in the design according to the primary placement and function of every logic macro. In another aspect of the invention, a method for routing a plurality of metal interconnect layers of the integrated circuit is disclosed, wherein a wide signal net is decomposed into several narrow wire segments and routed in parallel. The separate wire segments are then rejoined at the source and sink of the net. The decomposition step is performed during the design phase and presumes the availability of empty wiring tracks adjacent to the original net. The parallel wire segments do not change the logic behavior of the circuit. This method may be implemented in a prior art routing tool and will result in locations on the chip where nets will be divided into one or more replica nets.

Typically, the above-mentioned preliminary functional routing step defines the routing structure only according to the functional constraints, and is not yet optimized for any other technical aspect. A single width wire has basically uniform spacing and width, the separation between adjacent, parallel wiring tracks is therefore typically twice the wire width dimension, as suggested in FIG. 1, with signal wires 12 and 14, or as depicted in FIG. 2 as spacing between wires 12 and 14. Where an empty wiring track is available, it is possible to insert an additional wire. Two empty wiring tracks may consequently be populated with two additional wires provided that design ground rules in regard to minimum spacing are observed.

The term "wide wire" shall be understood to mean any wire of a width, greater then a prescribed minimum width in accordance with design ground rules for a given process technology. A "double wide" wire denotes a wire segment that is twice the width of a minimum width wire. In the examples shown in FIGS. 1, 1A, 2 and 3 the minimum width is given by the width of signal wires 12 or 14. Those skilled in the art will recognize that an exemplar design will include multiple wire types with different widths depending on the particular signal application, i.e.: data bus, clock tree, power distribution, etc.

Preferably, a wire is replicated, if it has an aspect ratio length/width greater than 10:1, more preferred greater than 100:1 or greater than 1000:1. Accordingly, long parallel signal nets represent the largest population of potential candidates for application of the method described herein.

Another aspect of the invention is the benefit of redundancy introduced by parallel wiring such that an open circuit in one parallel net caused by a manufacturing defect will not necessarily cause a functional failure if another parallel net has been routed.

Those skilled in the art will appreciate the foregoing features of the invention enable a greater uniformity of on-chip wiring, which result in a commensurate increase in manufacturing yield.

BRIEF DESCRIPTION OF THE DRAWINGS

In the following detailed description of embodiments, reference is made to the accompanying drawings which form a part hereof, and in which are shown by way of illustration specific embodiments are described in sufficient detail to enable those skilled in the art to practice the invention, and it to be understood that other embodiments may be utilized and logical, structural, electrical and other changes may be made without departing from the scope of the present invention.

FIG. 1 is a simplified schematic plan view of an exemplar metal layer of an integrated chip circuit fabricated according to prior art and showing the initial wiring required by the logic functionality of the chip.

FIG. 1A shows an idealized section of wire segments according to FIG. 1, illustrating wires, spaces and tracks.

FIG. 2 is a schematic representation according to FIG. 1, illustrating additional wiring tracks.

FIG. 3 is a schematic representation according to a first embodiment illustrating a series of replicated wires belonging to the same net and a decomposed wide wire net.

DETAILED DESCRIPTION OF THE PREFERRED EMBODIMENTS

According to a first embodiment, FIG. 3 illustrates a metal interconnect segment corresponding to the nets in FIG. 2. In FIG. 3, wide wire 10 is decomposed into single width wires 31-34. Each of the termination points of wires 31-34 will ultimately connect to the same pin or wire structure (not shown). The number of additional single width wires should be adjusted such that the electrical properties of the former wide wire 10 remain basically unchanged, such that the wider a wire is, the more single width wires are required to ensure current density, resistance, electro-migration and timing constraints are met.

Figure 4:
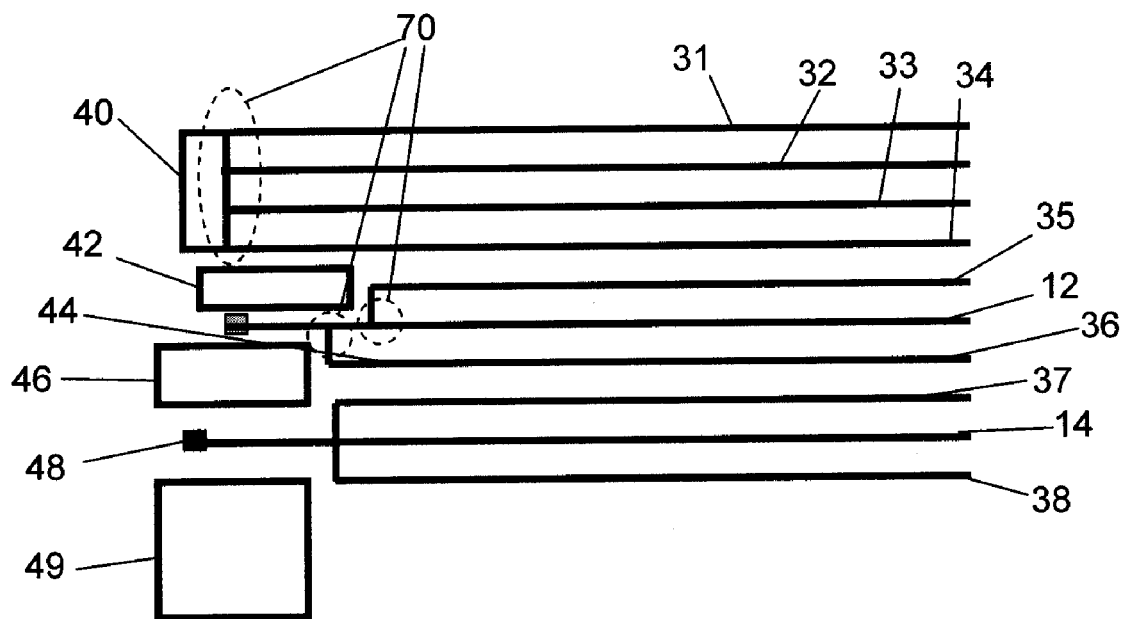
FIG. 4 is a schematic representation according to the first embodiment showing pin access in cases with and without the blockage shapes adjacent to the pin of a wire.

FIG. 4 illustrates an example of one possible termination configuration of the nets shown in FIG. 3. The metal geometry shown represents a single metal interconnect layer with no inter-layer connectivity. Thos skilled in the art will appreciate that many such termination combinations are possible whether or not the automated wire router is grid-based.

With further reference to FIGS. 3 and 4, original wide wire 10 is replaced by a plurality of single width wires 31, 32, 33, 34, by using a replication step to fill the empty tracks adjacent to wide wire 10 and tracks 16A and 16B originally occupied by wide wire 10. Further, it should be noted that wires 35 and 36 shown in FIG. 4 are electrically connected according to the present invention to wire 12 in contrast to prior art approaches, in which additional wires were used as shielding, such as wires 21 and 22 interposed between wires 12 and 14 in FIG. 2 and connected either to ground or Vdd.

The same concept is illustrated in FIG. 3 with the replication of wire 14 into a set of three wires 37, 14 and 38, again all interconnected between each other. In FIG. 2 the connections of wires 21, 22 and 23 to ground is indicated by printing those wires as a dotted line, in contrast to FIG. 3, where replicated wires are interconnected with the original logic single width wire 12 or 14, respectively.

As a comparison between FIG. 2 and FIG. 3 clearly illustrates, the wiring according to FIG. 3 offers the additional advantage that a short between a single width wire, for example wire 12 and its adjacent neighboring wires 35 or 36 will not cause a defect in the chip because they are interconnected electrically and thus define the same electrical net. Further, it should be noted that the process to interconnect replicated lines of the same net with each other could be interpreted as having an overall adverse effect on switching capacitance. In FIG. 3, for example, the capacitance of the net including wires 35, 12 and 36 is considerably increased compared to the capacitance of wire 12 alone. However, since wires 35 and 36 switch at the same time and in the same direction as wire 12, the cross-coupling capacitance between 12, 35 and 36 does not contribute to the switching capacitance. For deep sub-micron technologies this drawback is minor because the fraction P of fringe capacitance, i.e. the lateral capacitance implied by cross-coupling of adjacent wires, increases considerably from technology node to technology node, whereas the capacitance component due to wire area is less significant.

Figure 7:
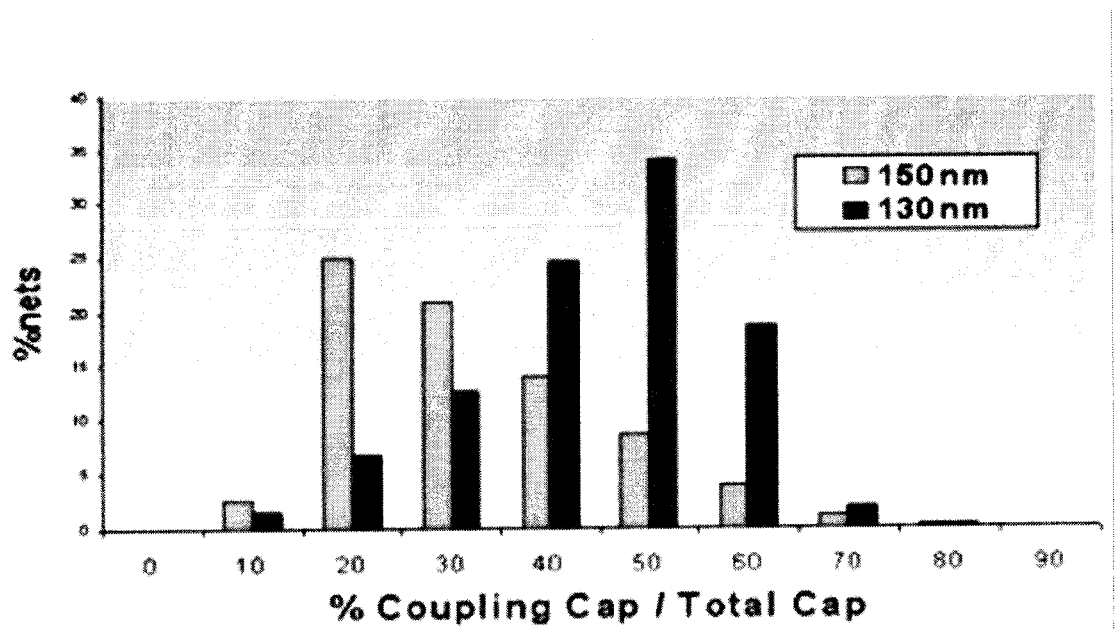
FIG. 7 is a chart depicting the percentage ratio of coupling capacitance to total capacitance as a percentage of the total number of nets for 150 nm and 130 nm process technologies.

FIG. 7 plots the impact of cross-coupling on total wire capacitance as a function of the total percentage of nets for two different process technology nodes. The x-axis shows the percentage of coupling (or fringe) capacitance of the total capacitance and the y-axis the percentage of nets that fall into each range. This chart shows clearly that the percentage of coupling capacitance increases with each process technology node. Those skilled in the art will appreciate that the average fringe capacitance increases from about 30% to 50% during a transition from the 150 nm to the 130 nm manufacturing technology. If fringing capacitance represents 50% of the total capacitance, this implies that the switching capacitance between two adjacent wires switching simultaneously in the same direction increases by 50% (or a factor of 1.5) compared to a single wire. However, due to the parallel instantiation of the single wire, the resistance decreases by a factor of 2. As a result, the delay along the wire (RxC) decreases by 25%. Wiring delay (RC) is the dominate factor for timing in deep sub-micron designs, so while the first embodiment might indeed add capacitance to the routing, the performance benefit realized by lower resistance will more then compensate for this difference.

As note above, FIG. 4 depicts an exemplary geometry for net termination showing access to pin shapes and the necessary routing to avoid impinging on blockage shapes. For example, decomposed single-width wires 31-34 all terminate at pin 40. In the presence of blockages 42, 46 and 49 depicted in FIG. 4, the pins 44 and 48 generally are very small compared to the lateral extension of replicated wires 35, 12, 36, or 37, 14, 38, respectively. In this case, replicated wires 35 and 36, and 37 and 38 respectively, will join the connection to wire 12 or wire 14 shortly in front of one of the blockages 42, 46 or 49 respectively. Thus, it is sufficient to connect the original wires 12 or 14, respectively, to the originally provided pins 44 or 48, respectively. The wire termination points 70 for the replicated single width wires switched in series are depicted.

Figure 5:
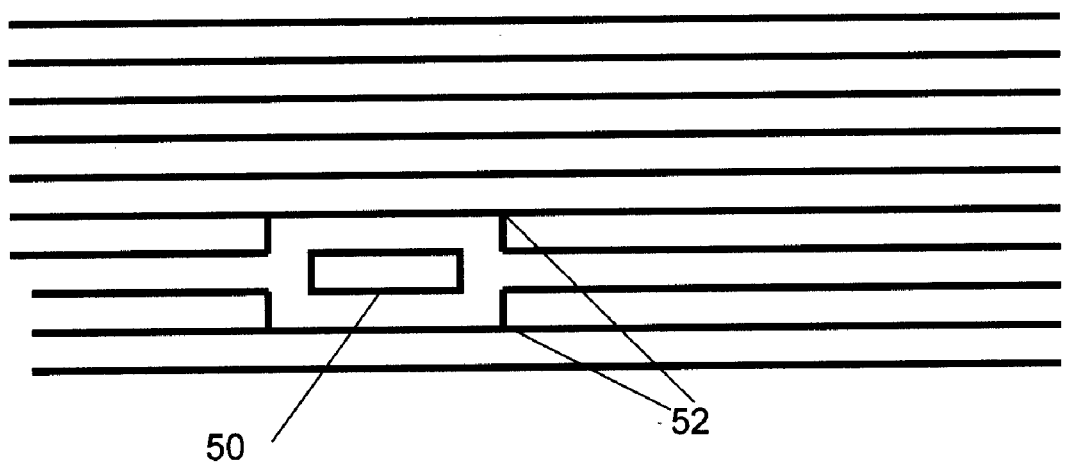
FIG. 5 is a schematic representation according to the first embodiment, illustrating the occurrence of a blockage shape surrounded by parallel wire segments.

FIG. 5 illustrates a metal layer geometry segment in which a blockage shape 50 is in the middle of the longitudinal extension of replicated wires. In this case it is proposed to connect the replicated line back to the original line and generate a bifurcation 52 into another replicated wire behind the blockages. This is depicted in FIG. 5. This proposal is consistent with the general aim of the invention to increase over all uniformity of the wiring. The degree of uniformity may thus be defined in terms of total area in a given metal plane, which has a parallel single width wire.

Figure 6:
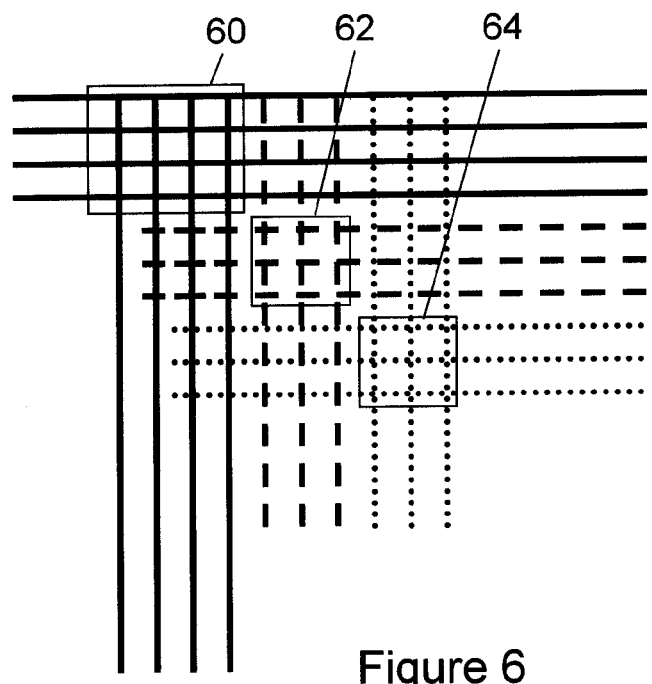
FIG. 6 is a schematic representation of exemplary via structures according to the first embodiment as defined by cross points of vertical and horizontal wires.

Referring to FIG. 6, an exemplary via structure according to the first embodiment is shown. In FIG. 6, the horizontal wires are assumed to be located in a first metal plane and the vertical wires in a second metal plane. There are three cross point areas 60, 62, and 64, each depicted with respective surrounding frames. According to the first embodiment, redundant vias are instantiated at each cross point of two single width wires, which must be connected to each other by a via. This follows the prior art requirement of providing redundant vias and has no negative effect on the wireability or of a particular integrated circuit chip design.

The present invention can be realized in hardware, software, or a combination of hardware and software. A routing tool according to the present invention can be realized in a centralized fashion in one computer system, or in a distributed fashion where different elements are spread across several interconnected computer systems. Any kind of computer system or other apparatus adapted for carrying out the methods described herein is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. A computer program in the present context is defined as any expression, in any language, code or notation, of a set of instructions intended to cause a system having an information processing capability to perform a particular function.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of routing a metal interconnect layer in an integrated circuit, the method comprising:
    defining a single-width wire having a width corresponding to a design ground rule minimum-width;
    defining a wide wire having a width greater than the design ground rule minimum-width;
    generating a net list from a logical design file;
    performing a first interconnect routing of the metal interconnect layer based on an initial physical placement of a plurality of logic elements within the integrated circuit;

replicating a first single-width wire such that multiple instances of the first single-width wire are routed in parallel and terminated in accordance with a source and a sink as defined in the net list;

decomposing a first wide wire into a plurality of single-width wires such that a resistance through the plurality of single-width wires is substantially equal to a resistance through the first wide wire; and iteratively routing the metal interconnect layer until a plurality of predefined design specifications are satisfied.

2. The method according to claim 1, wherein the interconnect metal layer is routed with an off-grid router.

3. The method according to claim 1, further comprising installing an automated software interconnect router on a distributed server system.

4. The method according to claim 1, further comprising a plurality of wire widths.

5. The method according to claim 1, wherein the replicating step is performed such that blockage shapes are not routed through and pin access is preserved.

6. The method according to claim 1, further comprising a plurality of redundant vias between adjacent metal layers.

7. The method according to claim 1, further comprising replicating a plurality of single width-wires.

8. The method according to claim 1, further comprising decomposing a plurality of wide wires.

9. The method according to claim 1, further comprising routing a plurality of interconnect metal layers.

10. The method according to claim 1, further comprising terminating a first signal at a common source and a common sink as defined in the net list.

11. The method according to claim 1, wherein the step of decomposing the first wide wire into a plurality of single-width wires is achieved without changing the logic behavior of the integrated circuit.

12. The method according to claim 1, wherein a single-width wire is replicated, if it has an aspect ratio (length/width) greater than 10:1.

13. The method according to claim 1, wherein a single width wire is replicated, if it has an aspect ratio (length/width) preferably greater than 100:1.

14. The method according to claim 1, wherein a single-width wire is replicated, if it has an aspect ratio length/width preferably greater than 1000:1.

15. A program storage device readable by a machine, tangibly embodying a program of instructions executable by the machine to perform method steps for implementing a voltage reference circuit, said method steps comprising:

defining a single-width wire corresponding to a design ground rule minimum-width;

defining a wide wire having a width greater than the design ground rule minimum-width;

generating a net list from a logical design file;

performing a first interconnect routing of the metal interconnect layer based on an initial physical placement of a plurality of logic elements within the integrated circuit;

replicating a first single-width wire such that multiple instances of the first single-width wire are routed in parallel and terminated in accordance with a source and a sink as defined in the net list;

decomposing a first wide wire into a plurality of single-width wires such that a resistance through the plurality of single-width wires is substantially equal to a resistance through the first wide wire; and iteratively routing the metal interconnect layer until a plurality of predefined design specifications are satisfied.

* * * * *